United States Patent
Gulati et al.

(10) Patent No.: US 9,165,641 B2
(45) Date of Patent: Oct. 20, 2015

(54) PROCESS TOLERANT CURRENT LEAKAGE REDUCTION IN STATIC RANDOM ACCESS MEMORY (SRAM)

(71) Applicant: QUALCOMM Incorporated, San Diego, CA (US)

(72) Inventors: Chirag Gulati, Kota/Rajasthan (IN); Ashish Akhilesh, Bangalore/Karnataka (IN); Venkatasubramanian Narayanan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 34 days.

(21) Appl. No.: 14/106,575

(22) Filed: Dec. 13, 2013

(65) Prior Publication Data

US 2015/0170736 A1 Jun. 18, 2015

(51) Int. Cl.
*G11C 11/00* (2006.01)
*G11C 11/417* (2006.01)
*G11C 5/14* (2006.01)
*G11C 7/12* (2006.01)

(52) U.S. Cl.
CPC .............. *G11C 11/417* (2013.01); *G11C 5/148* (2013.01); *G11C 7/12* (2013.01)

(58) Field of Classification Search
CPC .............. G11C 13/0007; G11C 11/417; G11C 2207/2227; G11C 11/5685; G11C 13/003; G11C 2213/73; G11C 29/12005; G11C 29/48; G11C 5/14; G11C 11/4074; G11C 5/145; H01L 27/11
USPC ................ 365/189.09, 226, 227, 185.27, 175, 365/181, 208, 229, 230.03, 72
See application file for complete search history.

(56) References Cited

U.S. PATENT DOCUMENTS

| | | | |
|---|---|---|---|
| 7,110,317 B2 | 9/2006 | Song et al. | |
| 7,149,142 B1 | 12/2006 | Fisher et al. | |
| 7,362,646 B2 | 4/2008 | Otsuka et al. | |
| 8,406,039 B2 | 3/2013 | Lee et al. | |
| 2005/0146920 A1* | 7/2005 | Zimlich | 365/149 |

(Continued)

OTHER PUBLICATIONS

Drennan P G et al: "Implications of Proximity Effects for Analog Design", Conference 2006, IEEE Custom Integrated Circuits, IEEE, Piscataway, NJ, USA, Sep. 1, 2006, pp. 169-176, XP031052445, DOI: 10.1109/CICC.2006.320869 ISBN: 978-1-4244-0075-1.
International Search Report and Written Opinion—PCT/US2014/070149—ISA/EPO—Mar. 17, 2015.

*Primary Examiner* — Thong Q Le
(74) *Attorney, Agent, or Firm* — Loza & Loza LLP

(57) ABSTRACT

A memory device biasing circuit is disclosed, the circuit having a pair of semiconductor devices coupled to receive a supply voltage having a supply voltage level suitable for operating a memory device in an active mode and operable for providing an adjustable biased voltage to the memory device that is greater than a minimal voltage level for operating the memory device in a data retention mode. The pair of semiconductor devices includes a first semiconductor device; and, a second semiconductor device that includes an opposite type of semiconductor device than the first semiconductor device such that the pair of semiconductor devices includes each of an N-type semiconductor device and a P-type semiconductor device. The memory device biasing circuit further includes a bias adjustment circuit coupled to the second semiconductor device and configured to adjust the operation of the second semiconductor device based on the supply voltage.

20 Claims, 12 Drawing Sheets

(56) References Cited

U.S. PATENT DOCUMENTS

| | | |
|---|---|---|
| 2006/0002223 A1 | 1/2006 | Song et al. |
| 2010/0149884 A1 | 6/2010 | Kumar |
| 2011/0007596 A1 | 1/2011 | Lee et al. |
| 2011/0261609 A1 | 10/2011 | Seshadri |
| 2011/0261629 A1 | 10/2011 | Seshadri et al. |
| 2011/0267880 A1 | 11/2011 | Swei et al. |
| 2013/0294149 A1 | 11/2013 | Deng |

* cited by examiner

PROCESS TOLERANT CURRENT LEAKAGE REDUCTION IN STATIC RANDOM ACCESS MEMORY (SRAM)

BACKGROUND

1. Field

Aspects of the present disclosure relate generally to memory devices, and more particularly, to a process tolerant current leakage reduction in static random access memory (SRAM).

2. Background

Power conservation for memory devices is highly desirable in almost all modern electronics due to such design considerations as length of run-time as well as scalability. Static random-access memory (SRAM) devices are a type of semiconductor memory device that uses bistable latching circuitry to store each bit, which may be referred to as a bitcell or SRAM cell. To reduce power consumption in embedded memory devices such as SRAM devices, modern memory device architectures are typically separated into a core array having one or more memory arrays that include memory banks composed of sets of bitcells, and periphery circuitry that may be used to access specific memory banks. The periphery circuitry includes write and read circuitry to store and recover, respectively, information in a particular memory bank as identified by a decoder. Memory banks that are not being accessed thus only need to be provided with enough power for the bistable latching circuitry in each bitcell to maintain the data stored therein.

SRAM memory devices typically have three different modes of operation. The first mode is an "active" mode in which the core array and the peripheral circuitry are in a ready state, and awaiting an input. In the active mode, a power supply line to each memory array and the peripheral circuitry is held high while a select line to each memory array is held low until an operation needs to be performed. The select line may then be brought high to select a particular memory array. The second mode is a "sleep retention" mode, in which it is desirable for whatever data has been written to the memory arrays to be maintained but for power consumption to be reduced. In the sleep retention mode, the peripheral circuitry is kept off while power is still provided on the power supply line to each memory array. The third mode is a "deep sleep" state, in which both the core array and the peripheral circuitry are turned off and maximum power savings are realized.

Although no power is supplied to the peripheral circuitry and only minimal power is supplied to the core array in the sleep retention mode, the memory device may still suffer power leakage in the core array. This is because any power supplied to core array results in power leakage. One common approach to reduce power leakage is referred to as source voltage biasing, where a supply side voltage is maintained at the same level, but a level for a ground voltage supplied to the memory array, referred to as a source voltage, is raised. Thus, headroom for the memory array, and thus leakage therefrom, is reduced. However, there are some constraints in this approach.

For example, in an SRAM device during the sleep retention mode of operation, the source voltage of the core array is raised to a point just below where it passes rail-to-rail voltage requirement for retaining data. This raised voltage is highly sensitive across process corners. A scheme is needed on top of conventional schemes to converge raised source voltage levels across process corners and to maximize reduction in SRAM core array leakage.

SUMMARY

The following presents a simplified summary of one or more aspects of the disclosed approach, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a memory device biasing circuit, including a pair of semiconductor devices coupled to receive a supply voltage having a supply voltage level suitable for operating a memory device in an active mode and operable for providing an adjustable biased voltage to the memory device for operating the memory device in a data retention mode. The pair of semiconductor devices includes a first semiconductor device and a second semiconductor device, wherein the second semiconductor device is an opposite type of semiconductor device than the first semiconductor device such that the pair of semiconductor devices includes each of an N-type semiconductor device and a P-type semiconductor device. A bias adjustment circuit is coupled to the second semiconductor device and configured to adjust the operation of the second semiconductor device based on the supply voltage.

Another aspect of the disclosure provides a method for current leakage reduction in a semiconductor device that includes switching a circuit including a pair of semiconductor devices and coupled to a memory device to provide a supply voltage from a power supply to the memory device at a first voltage level while bypassing the pair of semiconductor devices; adjusting an operational parameter of a selected semiconductor device in the pair of semiconductors using a bias adjustment signal; and reducing, based on the bias adjustment signal, a level of the supply voltage provided by the power supply to the memory device through the pair of semiconductor devices to reach a second voltage level that is greater than a minimal voltage level for the memory device to operate in a data retention mode, wherein the second voltage level is lower than the first voltage level.

Yet another aspect of the disclosure provides an apparatus for current leakage reduction in a semiconductor device that includes a circuit configured to couple to a memory device to provide a supply voltage from a power supply to the memory device at a first voltage level to allow the memory device to operate in an active mode, and a second voltage level to allow the memory device to operate in a non-active mode, the circuit including a pair of semiconductor devices through which the supply voltage from the power supply is provided to the memory device at the second level; and means for adjusting an operational parameter of a selected semiconductor device in the pair of semiconductors based on the supply voltage such that the second voltage level approaches a minimal voltage level for the memory device to operate in a data retention mode.

These and other aspects of the disclosure will become more fully understood upon a review of the detailed description, which follows.

BRIEF DESCRIPTION OF THE DRAWINGS

These and other sample aspects of the disclosure will be described in the detailed description that follow, and in the accompanying drawings.

Figure 1:
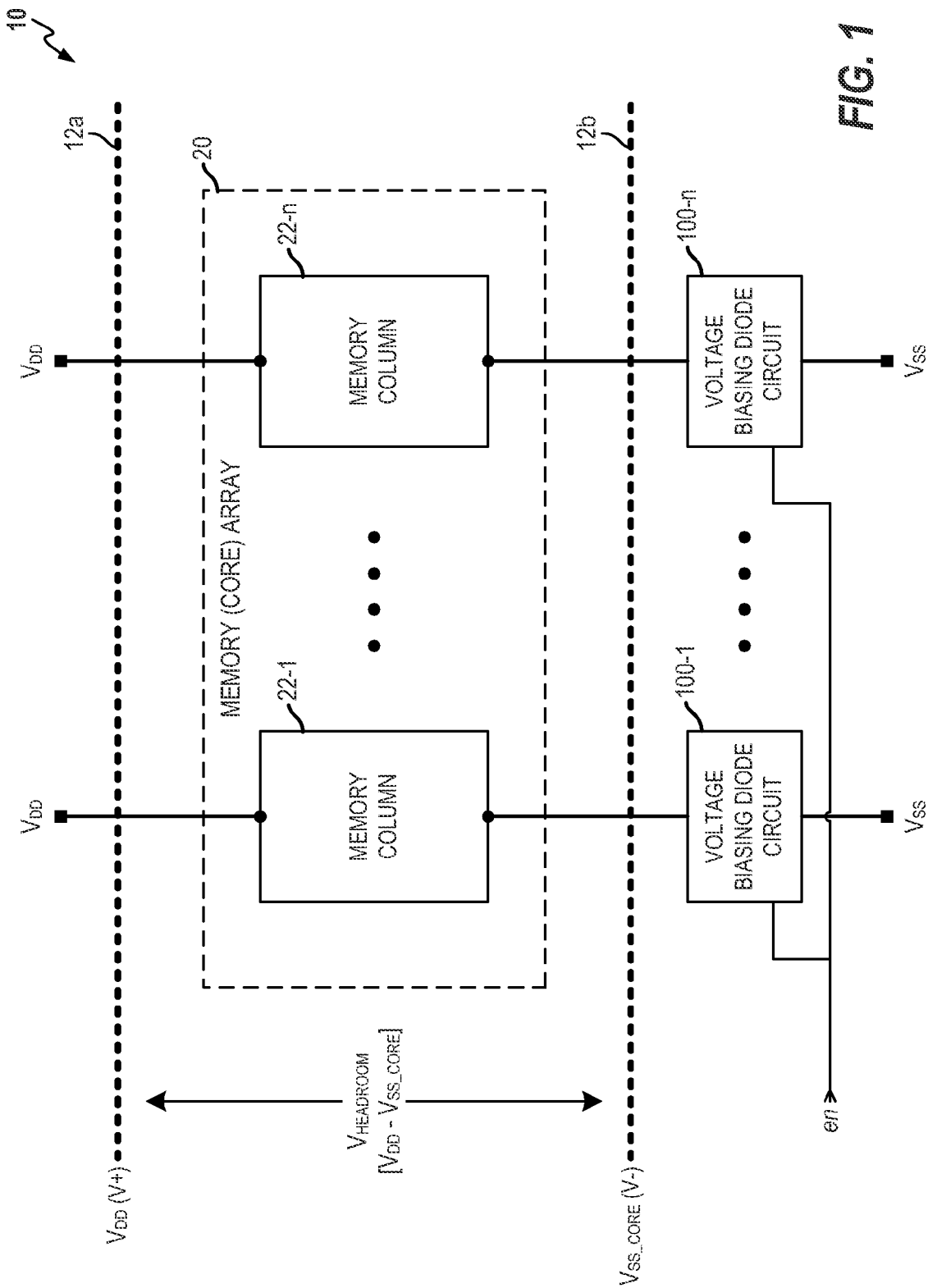
FIG. 1 is a block diagram of a first voltage biasing architecture that may be used to describe an existing voltage biasing approach for reducing current leakage in SRAMs.

In accordance with common practice, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

FIG. 1 illustrates a first voltage biasing architecture 10 that may be used to describe various current leakage reduction approaches for a memory array 20, which may include a plurality of memory columns 22-1 to 22-n. In the following discussion, the memory array 20 may also be referred to as a core array. No periphery or power supply circuitries are shown so as to avoid unnecessarily complicating the discussion. The memory array 20 is coupled to a positive voltage rail 12a and a negative voltage rail 12b, and supplied with a rail-to-rail voltage of $V_{DD}$ from the power supply circuitry on the positive voltage rail 12a, and $V_{SS\_CORE}$ from the power supply circuitry on the negative voltage rail 12b. In general, the rail-to-rail voltage available to the memory array 20 may also be referred to as a voltage headroom ($V_{HEADROOM}$), and is generally understood as a difference between a voltage level of a positive voltage rail and a voltage level of a negative voltage rail from a power supply. Because it is desirable for the memory array 20 to be provided with a sufficiently large $V_{HEADROOM}$ during normal operations, the negative voltage rail 12b is kept as close as possible to $V_{SS}$, which effectively may be considered to be at ground. However, when the memory array 20 is not in the active mode—such as when it is operating in the sleep retention mode—reducing $V_{HEADROOM}$ is desirable because current leakage from the memory array 20 is proportional to the level of voltage supplied to the memory array 20. Thus, reducing $V_{HEADROOM}$ when the memory array 20 is in the sleep retention mode should reduce current leakage and energy lost thereby. In order to ensure retention of data that is stored in the memory array 20, $V_{HEADROOM}$—i.e., the rail-to-rail voltage of the memory array 20, has to be maintained at a voltage level that is high enough for the memory array 20 to be able to preserve stored data.

In a conventional source voltage biasing approach, the negative voltage rail 12b is adjusted by a voltage biasing diode circuit 100 such that $V_{SS\_CORE}$ is raised to a voltage level that is higher than $V_{SS}$. Raising the level of $V_{SS\_CORE}$ effectively shrinks $V_{HEADROOM}$ by a difference between $V_{SS\_CORE}$ and $V_{SS}$. Thus, as $V_{HEADROOM}$ shrinks, current leakage should also decrease because of the lower level of voltage supplied to the memory array 20. Referring again to FIG. 1, the voltage biasing diode circuit 100 receives a control signal to operate the voltage biasing diode circuit 100 so that when $V_{HEADROOM}$ does need to be reduced, it may be communicated via an en input of the voltage biasing diode circuit 100. Specifically, the control signal provided to the en input will be "high" to cause the voltage biasing diode circuit 100 to bring $V_{SS\_CORE}$ very close to $V_{SS}$ in the active state. Conversely, the en input will be brought "low" to enable the raising of the level of $V_{SS\_CORE}$ and thus reduce $V_{HEADROOM}$.

Figure 2:
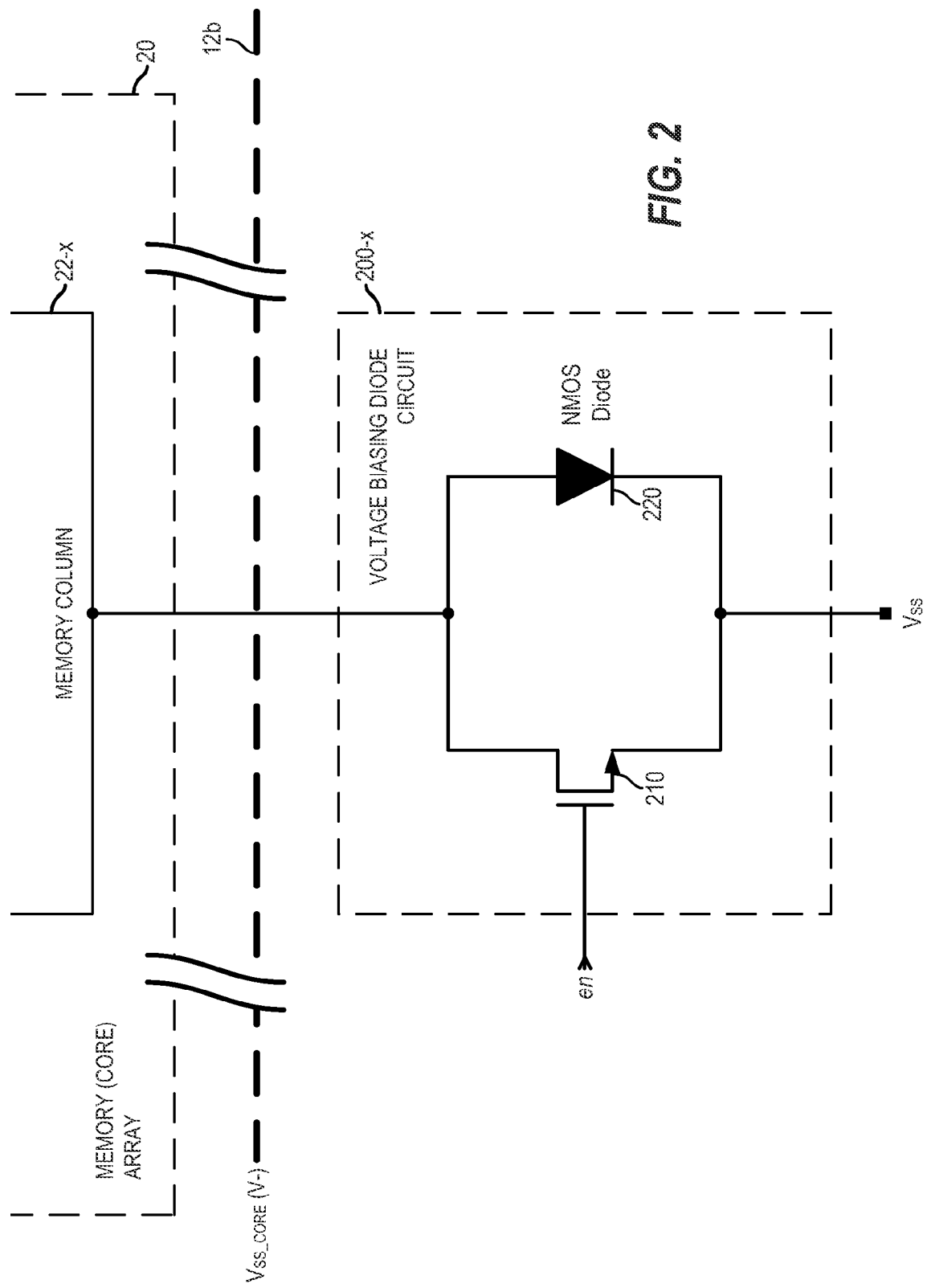
FIG. 2 is a circuit diagram of an existing voltage biasing diode configuration that may be used in the first voltage biasing architecture of FIG. 1.

FIG. 2 illustrates a voltage biasing diode circuit 200-x that may be used to implement any one of the plurality of voltage biasing diode circuits 100-1 to 100-n in the first voltage biasing architecture 10 of FIG. 1. The voltage biasing diode circuit 200-x may be used to bias the $V_{SS}$-side of the power supply circuitry to arrive at the biased core voltage, $V_{SS\_CORE}$, for a particular memory column 22-x of the memory array 20, and thereby compress $V_{HEADROOM}$ so as to reduce current leakage in the memory array 20 during an inactive mode of operation of the memory column 22-x. The voltage biasing diode circuit 200 utilizes a diode 220 to raise the level of $V_{SS\_CORE}$ with respect to $V_{SS}$. Specifically, one terminal of the diode 220 is connected to $V_{SS\_CORE}$ and another terminal of the diode 220 is connected to $V_{SS}$ so that $V_{SS\_CORE}$ is raised from $V_{SS}$ by a threshold voltage ($V_T$) of the diode 220. An NMOS transistor 210 controls the operation of the voltage biasing diode circuit 200-x such that when an en input of the NMOS transistor 210 receives a high input, the NMOS transistor 210 will turn on and allow the level of $V_{SS\_CORE}$ to come close to $V_{SS}$ to allow the memory column 22-$x$ to operate in the active state.

Traditionally, when devices supplying desired functionality for a circuit are located on a portion of the circuit that is close to the $V_{SS}$-side of the power supply circuitry, they are implemented using NMOS devices. Thus, when there is a need for a diode, an NMOS diode (e.g., a diode-connected NFET) is often used. Referring again to FIG. 2, the diode 220 of the voltage biasing diode circuit 200 is an NMOS diode. In other words, an NMOS device is used to track an adjustment to $V_{HEADROOM}$ for the memory array 20 by the voltage biasing diode circuit 200. The same concept described for using an NMOS diode to track an adjustment to $V_{SS}$ to arrive at $V_{SS\_CORE}$ may be applied to using a PMOS diode for tracking an adjustment to $V_{DD}$ to arrive at $V_{DD\_CORE}$, as discussed herein.

Figure 6:
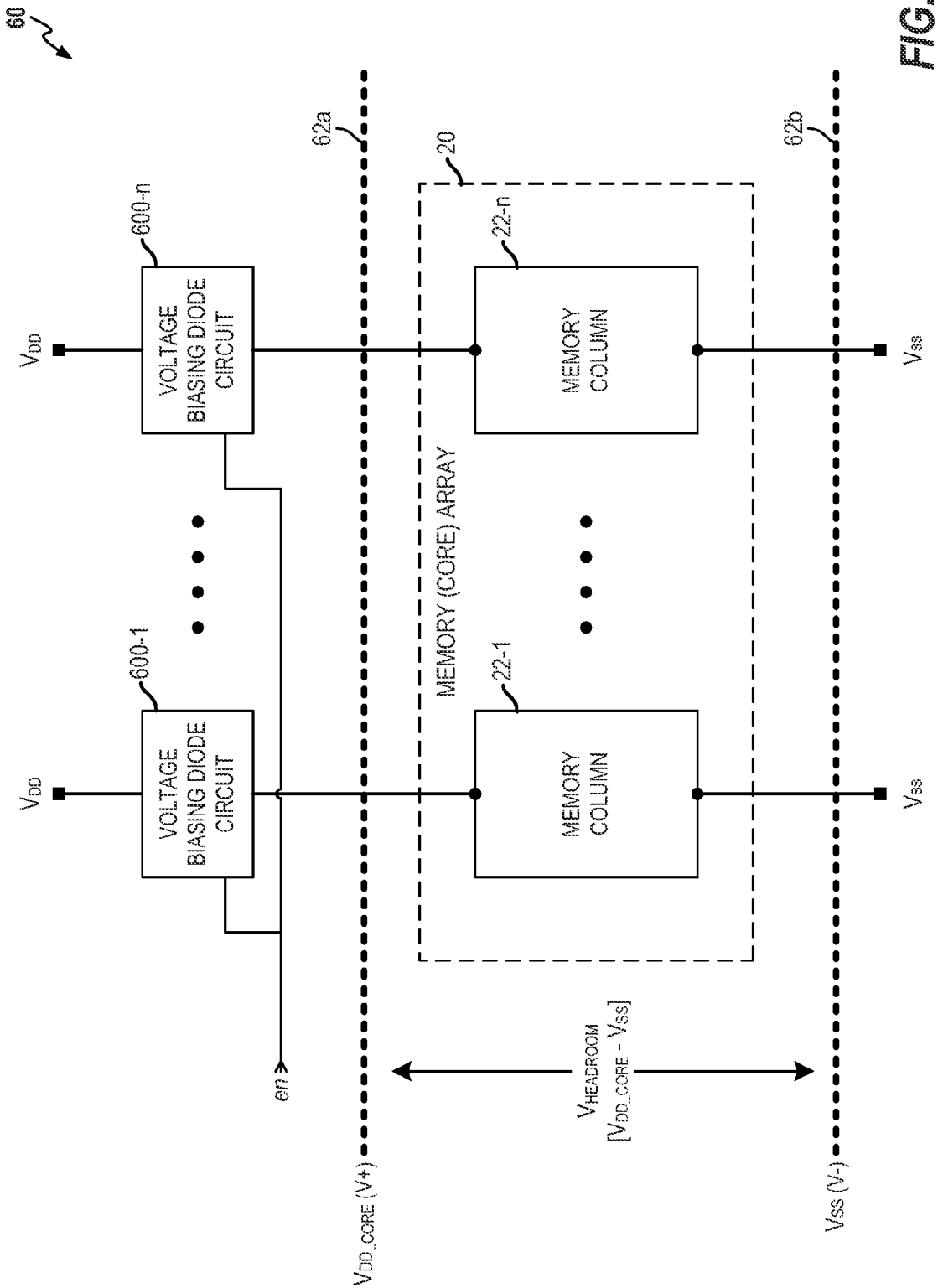
FIG. 6 is a block diagram of a second voltage biasing architecture that may be used to describe another existing voltage biasing approach for reducing current leakage in SRAMs.

FIG. 6 illustrates another approach to voltage biasing in a second voltage biasing architecture 60 that operates to reduce current leakage in the memory array 20 using a $V_{HEADROOM}$ reduction approach similar to one used by the first voltage biasing architecture 10 of FIG. 1. In contrast to the approach embodied by the first voltage biasing architecture 10, the second voltage biasing architecture 60 achieves a reduction of $V_{HEADROOM}$ by decreasing the voltage level provided to the memory array 20 from the $V_{DD}$-side of the power supply circuitry. Thus, the memory array 20 is still coupled to a positive voltage rail 62a and a negative voltage rail 62b, but is supplied with a rail-to-rail voltage of $V_{DD\_CORE}$ from the power supply circuitry on the positive voltage rail 62a and $V_{SS}$ from the power supply circuitry on the negative voltage rail 62b, as shown in FIG. 6, in contrast to the rail-to-rail voltage of $V_{DD}$ from the positive voltage rail 12a and $V_{SS\_CORE}$ from the negative voltage rail 12b as shown in FIG. 1.

Figure 7:
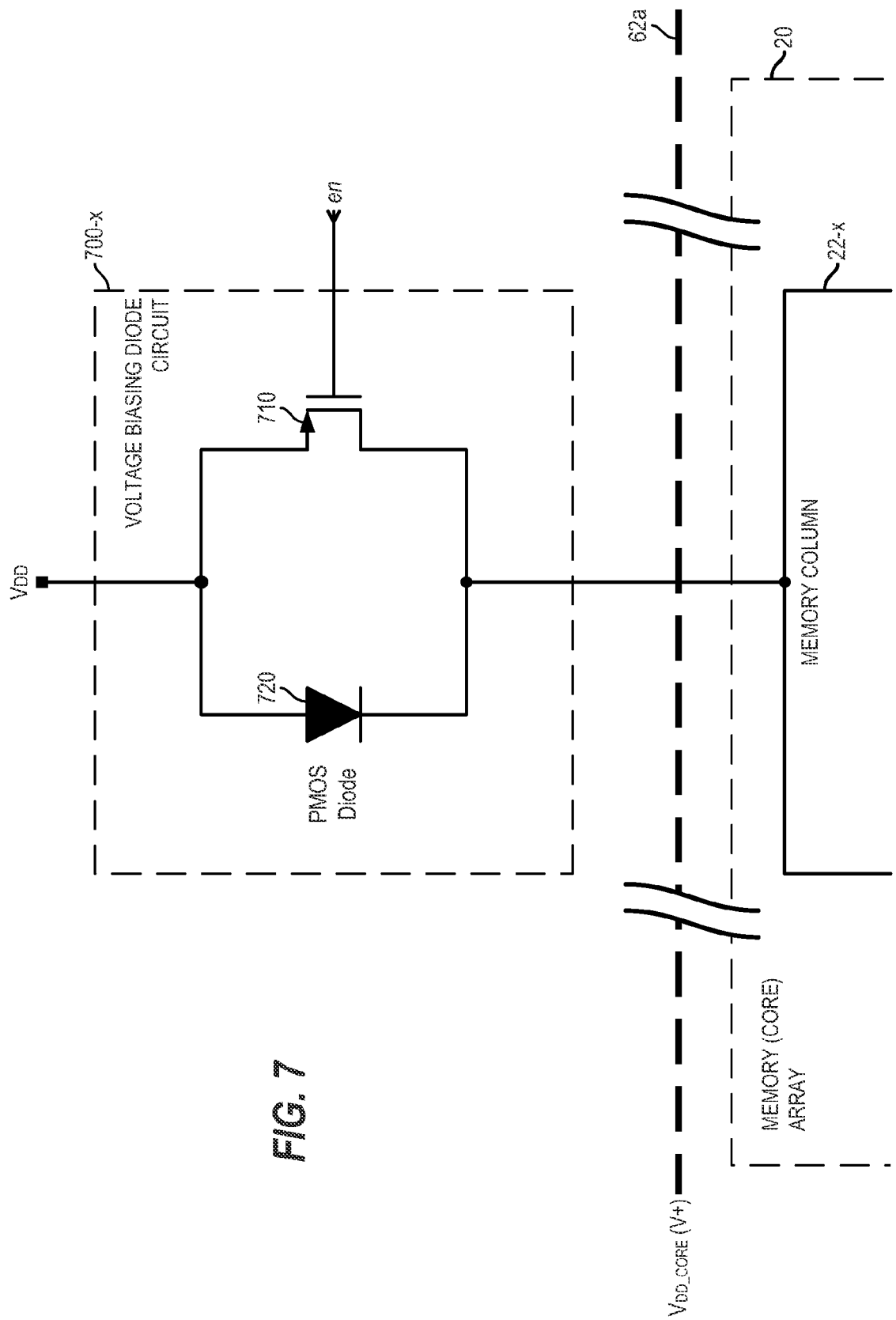
FIG. 7 is a circuit diagram of an existing voltage biasing diode configuration that may be used in the second voltage biasing architecture of FIG. 6.

FIG. 7 illustrates a voltage biasing diode circuit 700-$x$ that may be used to implement any one of the plurality of voltage biasing diode circuits 600-1 to 600-$n$ in the second voltage biasing architecture 60 of FIG. 6. The voltage biasing diode circuit 700-$x$ may be used to bias $V_{DD}$ to arrive at the biased voltage, $V_{DD\_CORE}$, for a particular memory column 22-$x$ of the memory array 20, and thereby compress $V_{HEADROOM}$ so as to reduce current leakage in the memory array 20 during an inactive mode of operation of the memory column 22-$x$. The voltage biasing diode circuit 700 utilizes a diode 720 (e.g., a diode-connected PFET) to lower the level of $V_{DD\_CORE}$ with respect to $V_{DD}$. Specifically, one terminal of the diode 720 is connected to $V_{DD}$ and another terminal of the diode 720 is connected to $V_{DD\_CORE}$ so that $V_{DD\_CORE}$ is lowered from $V_{DD}$ by a threshold voltage ($V_T$) of the diode 720. A PMOS transistor 710 controls the operation of the voltage biasing diode circuit 700-$x$, similar to how the NMOS transistor 210 operates to control the voltage biasing diode circuit 200-$x$. As the PMOS transistor 710 is a P-type semiconductor device, the value of the enable signal for the PMOS transistor 710 is the opposite of the enable signal of the NMOS transistor 210 in FIG. 2. Thus, when an en input of the PMOS transistor 710 receives a low enable signal, the PMOS transistor 710 will turn on. This will allow the level of $V_{DD\_CORE}$ to come close to $V_{DD}$ and thereby the memory column 22-$x$ to operate in the active state. In other words, the enable signal for the PMOS transistor 710 should be low for the active mode and high for the inactive mode.

To reduce the risk of data loss under either approach, the memory column 22-$x$ of the memory array 20 must be provided with a voltage level of $V_{HEADROOM}$ that is at least as high as the voltage level necessary for data retention. This minimal voltage level for data retention, referred to as $V_{DR}$, must be maintained across all process, voltage and temperature (PVT) variations. As discussed above, typical memory core voltage bias approaches use either an NMOS device, such as in the diode 220 of the voltage biasing diode circuit 200 of FIG. 2; or a PMOS device, such as the diode 720 of the voltage biasing diode circuit 700 of FIG. 7, to reduce $V_{HEADROOM}$. However, some of the current leakage is caused by NMOS devices and some is contributed by PMOS devices. As such, because both the voltage biasing diode circuit 200 and the voltage biasing diode circuit 700 have been designed based on one type of device, neither can efficiently bias $V_{HEADROOM}$, which means current leakage is not minimized. For example, in the case where the voltage is being biased by the voltage biasing diode circuit 200, if NMOS devices are weak and PMOS devices are strong, then PMOS devices, which cause the major source of the leakage, are not being tracked. To compensate, the diode 220 has to be sized conservatively such that the diode 220 is more conductive to reduce the difference between $V_{SS\_CORE}$ and $V_{SS}$ resulting in a higher level of $V_{HEADROOM}$ to ensure that the memory array 20 will receive a supply voltage that is at least as high as $V_{DR}$. The increase of $V_{HEADROOM}$ would correspond with an increase in the leakage current, which is undesirable.

Various aspects of the disclosed approach provide for robust memory design across different process corners. In semiconductor manufacturing, variation of fabrication parameters from an integrated circuit design often result during an application of that integrated circuit design to a semiconductor wafer. Process corners represent extremes of these fabrication parameter variations within which a circuit having semiconductor devices etched onto the wafer must function correctly. For example, in Very-Large-Scale Integration (VLSI) integrated circuit microprocessor design and semiconductor fabrication, a process corner may represent a variation from nominal doping concentrations in transistors on a silicon wafer. Although a particular circuit fabricated from semiconductor devices operating at these process corners may run slower or faster, and/or at lower or higher temperatures and voltages, from an "ideal" circuit fabricated from semiconductor devices operating at nominal, or "typical," levels, the circuit should function at these process extremes if the circuit has adequate design margins.

Conventionally, two-letter designators are used to identify process corners, where the first letter refers to the N-channel metal oxide semiconductor field effect transistor (MOSFET) (NMOS) corner, and the second letter refers to the P channel (PMOS) corner. Each of the first and second letters may be one of three designations: typical (T), fast (F), or slow (S). Devices characterized as having fast corners exhibit carrier mobilities that are higher than a nominal level, while devices characterized as having slow corners exhibit carrier mobilities that are slower than the nominal level. For example, a corner designated as SF denotes slow NFETs and fast PFETs. There are five possible combinations of corners for devices in a circuit: typical-typical (TT), fast-fast (FF), slow-slow (SS), fast-slow (FS), and slow-fast (SF). Circuits having TT, FF, and SS corners are referred to as "even" corner circuits, because both types of devices in these circuits are affected evenly. Circuits having FS and SF corners are referred to as "skewed" corner circuits because one type of FET in these circuits will switch much faster than the other (e.g., NFETs will switch much faster than PFETs in a circuit with FS corners, with the opposite being true in a circuit with SF corners). Because of these imbalances, these circuits may include devices that have different threshold voltages and other characteristics.

For example, an SRAM circuit with a core array having skewed corners may require divergent levels of source voltages for proper source voltage biasing of the core array because each type of device has opposite corners. The imbalance results in a conservative approach to setting levels of source voltage bias, which reduces efficacy of contemporary current leakage reduction mechanisms for SRAM core arrays. Having only an NMOS-type or a PMOS-type device to raise the $V_{SS\_CORE}$ or lower the $V_{DD\_CORE}$ voltages, respectively, will not allow tracking across different process corners such as SF and FS. For example, SF may become the limiting corner for the $V_{SS\_CORE}$ voltage for NMOS-type device-based voltage biasing, which makes the $V_{SS\_CORE}$ voltage at other corners such as TT and FF drop below its maximum. Similarly, FS may become the limiting corner for the $V_{DD\_CORE}$ voltage for PMOS-type device-based voltage biasing.

Because increased SRAM core array leakage resulting from a raised voltage level from the negative side of the power supply circuitry (i.e., $V_{SS\_CORE}$) or a lowered voltage level from the positive side of the power supply circuitry (i.e., $V_{DD\_CORE}$) is highly dependent on different cross corners, various aspects of the disclosed approach include a determination of a specific level of voltage of core array (either $V_{SS\_CORE}$ or $V_{DD\_CORE}$) should be made based on both types of devices (i.e., NMOS and PMOS devices). In one aspect of the disclosed approach, a balanced voltage biasing circuit is configured to supply a proper level of voltage biasing, also referred to as an adjustable biased voltage, in an inactive mode of operation, such as the sleep retention mode of operation, in view of process variations in an SRAM core array. Further, maximum reduction in leakage of the SRAM core array during the inactive mode of operation may be achieved by optimizing the level of voltage bias. For clarity of reference and of the following discussion, various aspects of the disclosed approach of voltage biasing to address a voltage biasing configuration represented by the first voltage biasing architecture 10 of FIG. 1 will be referred to herein generally as an NMOS-based voltage biasing. In addition, various aspects of the disclosed approach of voltage biasing to address a voltage biasing configuration represented by the second voltage biasing architecture 60 of FIG. 6 will be referred to herein generally as an PMOS-based voltage biasing.

Figure 3:
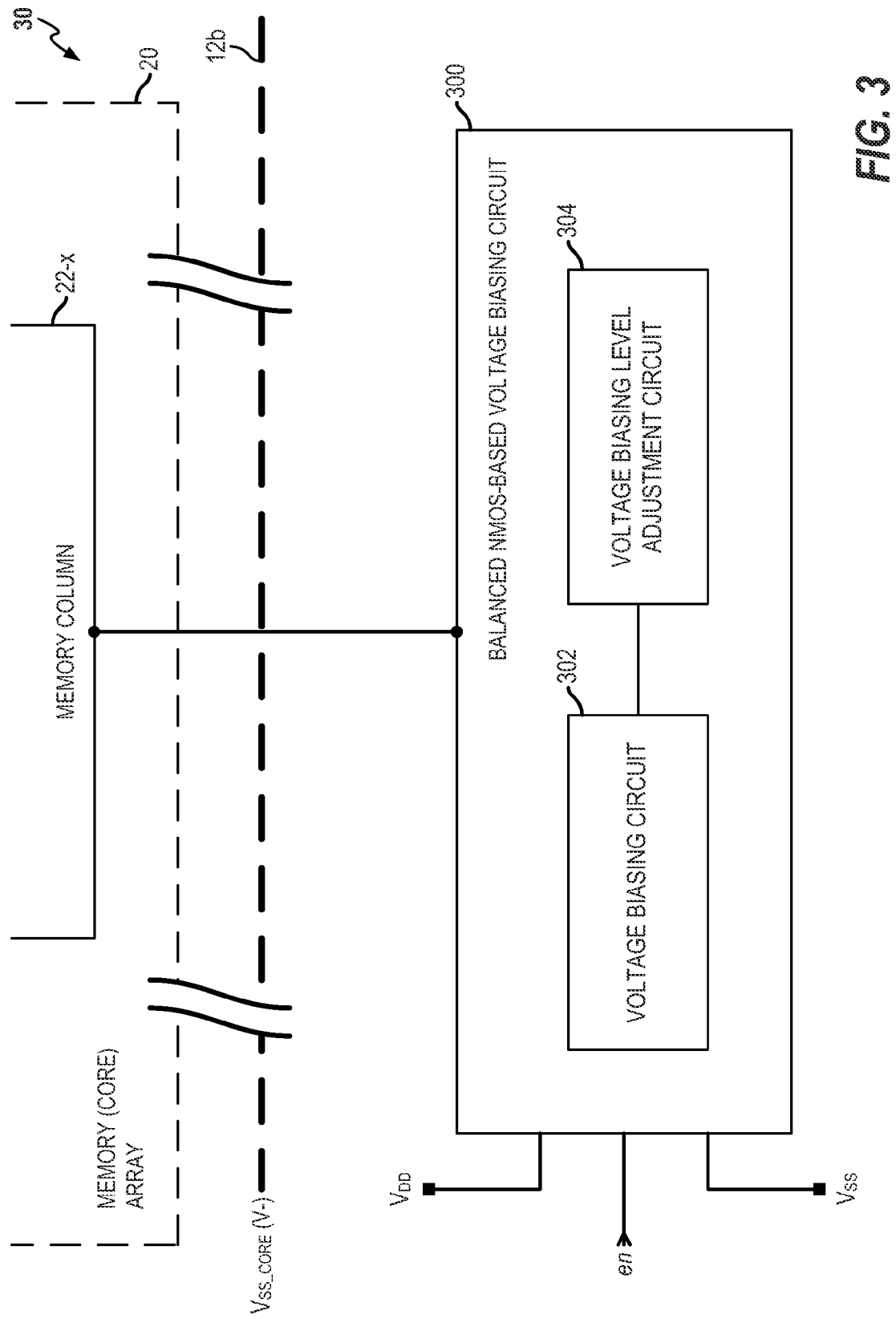
FIG. 3 is a block diagram of a balanced NMOS-based voltage biasing architecture configured in accordance with various aspects of the disclosed approach for process tolerant reduction of current leakage in SRAMs.

FIG. 3 illustrates a voltage biasing approach implemented in a balanced NMOS-based voltage biasing architecture 30 that includes a balanced NMOS-based voltage biasing circuit 300 with a voltage biasing circuit 302 and a voltage biasing level adjustment circuit 304. The voltage biasing circuit 302 may be adjusted with the voltage biasing level adjustment circuit 304 to compensate for differences in characteristics of devices in the voltage biasing circuit 302, as further described herein. An "en" signal is used to switch the memory device from an active state to a sleep-retention state, as further described herein.

Figure 4:
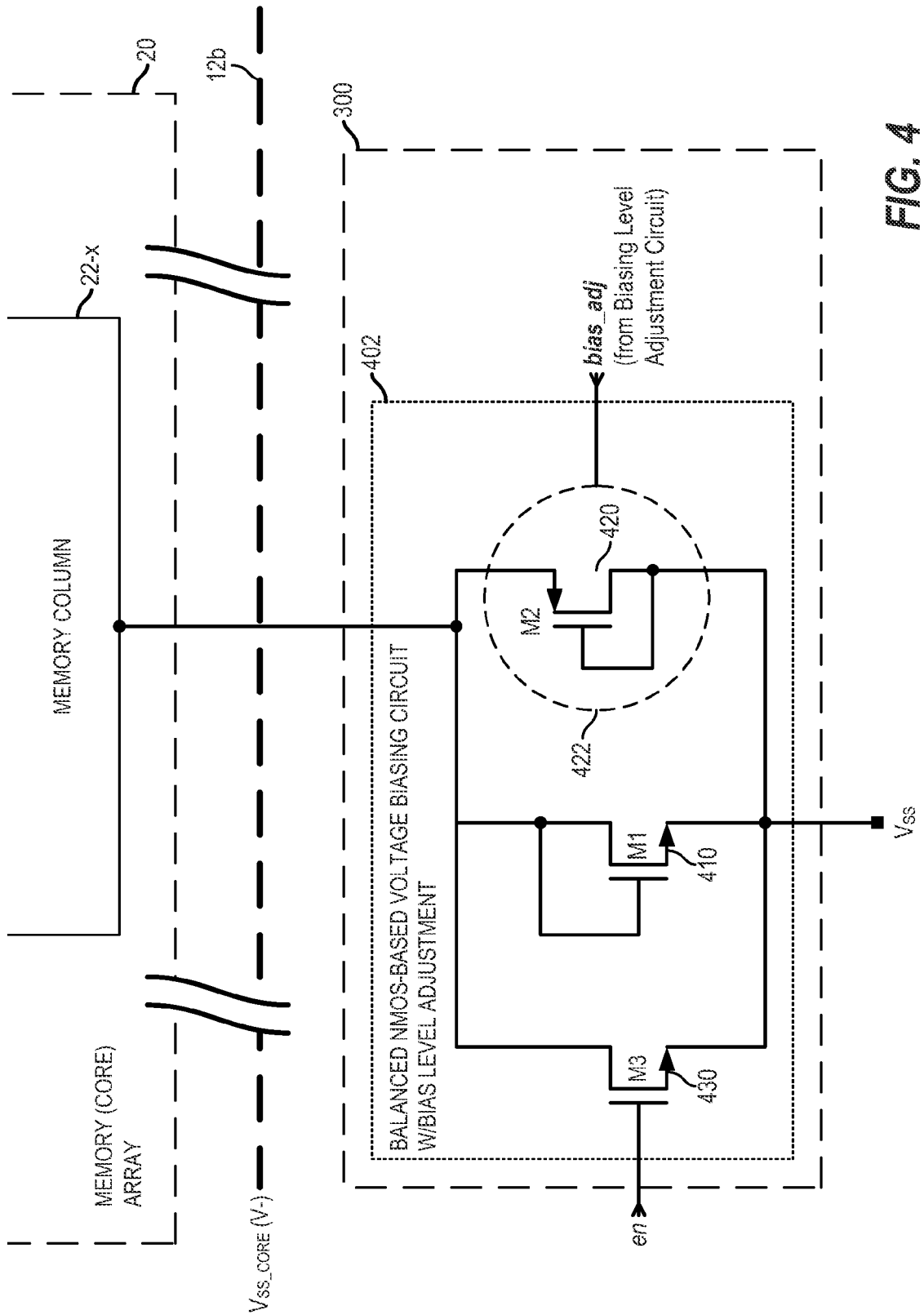
FIG. 4 is a circuit diagram of a balanced NMOS-based voltage biasing circuit having a bias level adjustment mechanism configured in accordance with various aspects of the disclosed approach for process tolerant reduction of current leakage in SRAMs that may be used in the balanced NMOS-based voltage biasing architecture of FIG. 3.

FIG. 4 illustrates a balanced NMOS-based voltage biasing circuit 402 that may be implemented as the voltage biasing circuit 302 in the balanced NMOS-based voltage biasing circuit 300 of the balanced NMOS-based voltage biasing architecture 30 of FIG. 3 for biasing the voltage level of $V_{SS}$ to arrive at the biased voltage level of $V_{SS\_CORE}$, for the memory array 20. The balanced NMOS-based voltage biasing circuit 402 includes a pair of semiconductor devices, including a first semiconductor device M1 410 and a second semiconductor device M2 420. In one aspect of the disclosed approach, the first semiconductor device M1 410 is an NMOS device and the second semiconductor device M2 420 is a PMOS device. A third semiconductor device M3 430 may be operated by an "en" signal to control the operation of the balanced NMOS-based voltage biasing circuit 402. As shown, the third semiconductor device M3 430 is an NMOS device and a "high" enable signal will allow $V_{SS\_CORE}$ to come close to $V_{SS}$, effectively bypassing the pair of semiconductor devices and enabling operation of the memory column 22-x in the active state. For the first semiconductor device M1 410, its gate and drain terminals are connected to $V_{SS\_CORE}$ and its source terminal is connected to $V_{SS}$. The second semiconductor device M2 420 has its source terminal coupled to $V_{SS\_CORE}$ and its gate and drain terminals connected to $V_{SS}$.

During an inactive, sleep retention, mode of operation of the memory array 20, the first semiconductor device M1 410 and the second semiconductor device M2 420 are used to raise the level of $V_{SS\_CORE}$ with respect to $V_{SS}$ and compress $V_{HEADROOM}$ so as to reduce current leakage in the memory array 20. To retain data that is stored in the memory array 20, $V_{HEADROOM}$—i.e., the rail-to-rail voltage of the memory array 20, has to be maintained at the aforementioned minimal level of $V_{DR}$ across different process corners. In one aspect of the disclosed approach, both the first semiconductor device M1 410 and the second semiconductor device M2 420 are sized such that an optimum size ratio of both the devices will converge the raised voltage of memory array 20 (i.e., $V_{SS\_CORE}$) at different process corners. This in turns make the scheme more robust with regard to different process corner and will provide maximum utilization of the biased voltage to obtain a reduction in current leakage.

It should be noted that the second semiconductor device M2 420 is a distributed PMOS device that is placed near first semiconductor device M1 410 and third semiconductor device M3 430, both of which are NMOS devices. Because of high well proximity effect (WPE), certain operational parameters of the second semiconductor device M2 420 will affected. With regard to one operational parameter of interest in particular, the second semiconductor device M2 420 will become a degraded enhancement mode pass transistor device with a higher threshold voltage ($V_{THP}$). The higher $V_{THP}$ will skew operation of the balanced NMOS-based voltage biasing circuit 402 towards the undesirable type of behavior as demonstrated by the traditional NMOS diode circuit described above and diverge $V_{HEADROOM}$ across different process corners. In addition, a change in any operational parameter of the second semiconductor device M2 420 will result in it having operating characteristics less like other P-type semiconductor devices in the memory column 22-x, which is undesirable as the second semiconductor device M2 420 should operate as would an average P-type semiconductor device in the memory column 22-x so that $V_{HEADROOM}$ may be adjusted by the balanced NMOS-based voltage biasing circuit 402 in an efficient manner.

In one aspect of the disclosed approach, the second semiconductor device M2 420 may be configured to be adjustable such that a bias adjustment voltage, referred to as $V_{bias\_adj}$, may be applied to a body 422 of the second semiconductor device M2 420 via a "bias_adj" signal from a biasing level adjustment source such as the voltage biasing level adjustment circuit 304. The voltage biasing level adjustment circuit 304 may be used to control a voltage provided to the bulk portion of the second semiconductor device M2 420 so as to change the $V_{THP}$ of the second semiconductor device M2 420, and thereby $V_{HEADROOM}$ across different PVT. For example, by providing a different level of voltage from $V_{DD}$ to the body 422 of the second semiconductor device M2 420, a new threshold voltage $V_{T\text{-}new}$ for the second semiconductor device M2 420, may be configured.

Figure 5A:
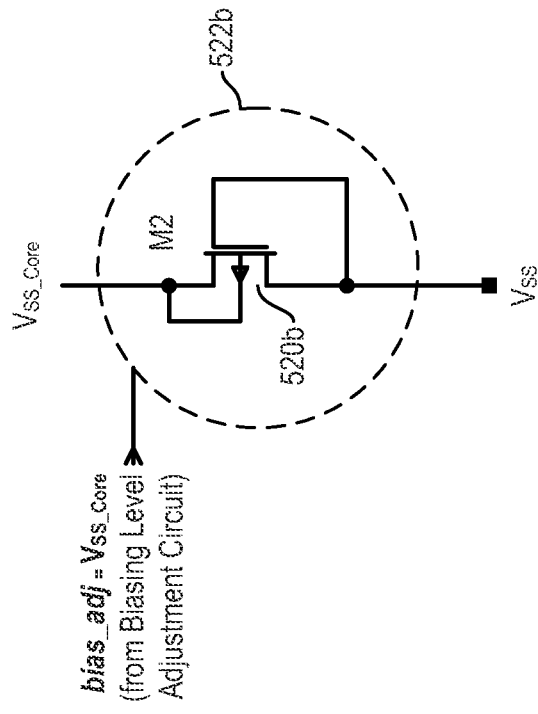
FIGS. 5a-b are circuit diagrams that may be used to describe various approaches to providing the bias level adjustment mechanism of FIG. 4.
Figure 5B:
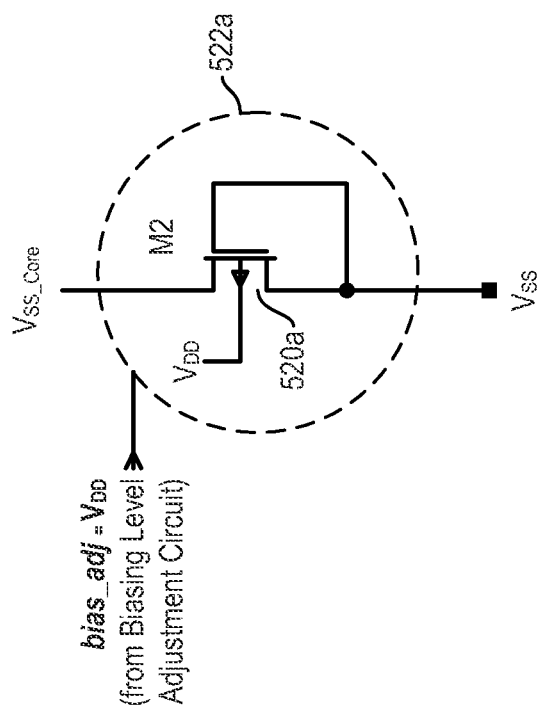

FIGS. 5a-b illustrate various aspects of providing the bias adjustment voltage that may be used to affect the operation of the second semiconductor device M2 420. In these approaches, the voltage biasing level adjustment circuit 304 may be considered be a voltage source, as described herein. FIG. 5a illustrates one aspect of the disclosed approach, where the bias_adj signal of $V_{DD}$ is applied to the body 422 of the second semiconductor device M2 420, designated with 522a and 520a, respectively. In this configuration, the bulk of the second semiconductor device M2 420 is connected to $V_{DD}$ while the source of the second semiconductor device M2 420 is connected to $V_{SS\_CORE}$. As such, the second semiconductor device M2 420 may experience a higher body effect and degrades the PMOS with higher $V_{THP}$. As the bulk is connected to $V_{DD}$, there will be a slight dependency of $V_{THP}$ of the second semiconductor device M2 420 on $V_{DD}$, where $V_{DD}$ changes will help the $V_{HEADROOM}$ converge across different $V_{DD}$.

FIG. 5b illustrates another aspect of the disclosed approach to compensate for the WPE experienced by the second semiconductor device M2 420, where the body 422 of the second semiconductor device M2 420, designated as 522b and 520b, respectively, is coupled to $V_{SS\_CORE}$. Specifically, the source and bulk of the second semiconductor device M2 420 may be coupled together. In this approach, the $V_{THP}$ of the second semiconductor device M2 420 may be reduced, and a balancing of the NMOS and PMOS devices may settle at an optimum point to obtained increased leakage reduction. Here, as the bulk of the second semiconductor device M2 420 is connected to $V_{SS\_CORE}$, it will bias itself depending on the voltage level of $V_{SS\_CORE}$, which depends on the total current leakage experienced by the memory array 20. Neither of the above cases requires a biasing circuit other than a voltage source as both $V_{DD}$ and $V_{SS\_CORE}$ are available. In another aspect of the disclosed approach, a biasing circuit may be used to provide an adjustment voltage to the bulk of the second semiconductor device M2 420 that may range from the adjustable biased voltage the adjustable biased voltage ($V_{SS\_CORE}$) to a positive voltage rail (e.g., $V_{DD}$).

As discussed above, in the memory array 20, some of the current leakage is caused by NMOS devices and some is contributed by PMOS devices. In the balanced NMOS-based voltage biasing circuit 402, a pair of semiconductor devices, which includes an NMOS device as well as a PMOS device, is used to track an adjustment to $V_{HEADROOM}$. As such, when NMOS devices are weak and PMOS devices are strong, PMOS devices, which cause the major source of the leakage in this scenario, may be tracked. Thus, compensation for any imbalance between different types of semiconductor devices by relying solely on one type of semiconductor device may be reduced. For example, in contrast to the source voltage biasing approach disclosed with reference to the voltage biasing diode circuit 200—in which the diode 220 has to be sized conservatively such that the diode 220 is more conductive, and the difference between $V_{SS\_CORE}$ and $V_{SS}$ is smaller—specification of the first semiconductor device M1 410 and second semiconductor device M2 420 may be optimized without needing to account for such compensation.

Figure 8:
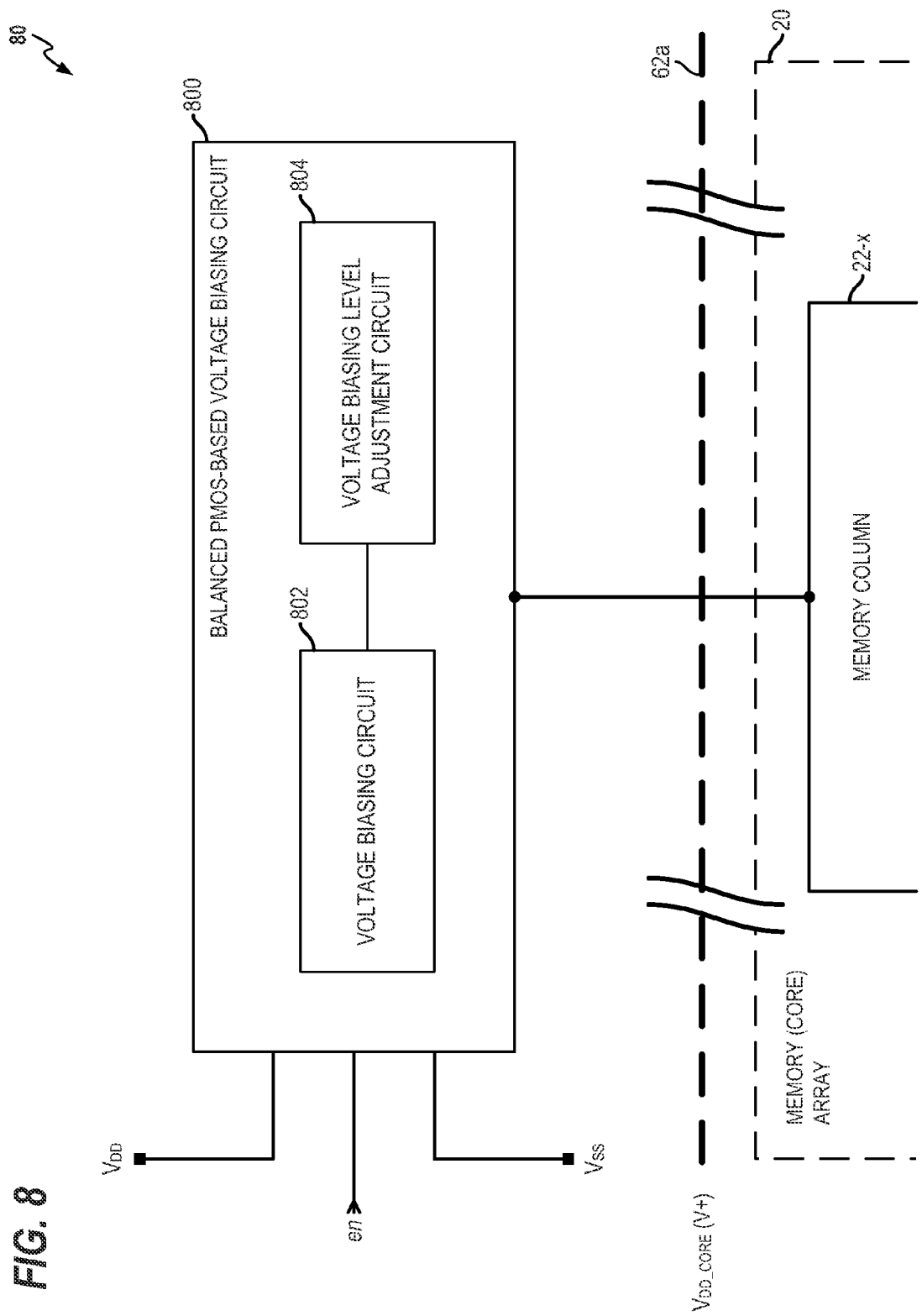
FIG. 8 is a block diagram of a balanced PMOS-based voltage biasing architecture configured in accordance with various aspects of the disclosed approach for process tolerant reduction of current leakage in SRAMs.

Various aspects of the disclosed approach for adjusting $V_{HEADROOM}$ using source voltage biasing as described in FIGS. 3-5 may be applied in a similar fashion to adjusting $V_{HEADROOM}$ using another approach for voltage biasing where, as illustrated in FIG. 8, a balanced PMOS-based voltage biasing architecture 80 is shown that includes a balanced PMOS-based voltage biasing circuit 800 with a voltage biasing circuit 802 and a voltage biasing level adjustment circuit 804. Similar to the operation of the voltage biasing circuit 302, the voltage biasing circuit 802 may be adjusted with the voltage biasing level adjustment circuit 804 to compensate for differences in characteristics of devices in the voltage biasing circuit 802, as further described herein. An "en" signal is used to switch the memory device from an active state to a sleep-retention state, as further described herein.

Figure 9:
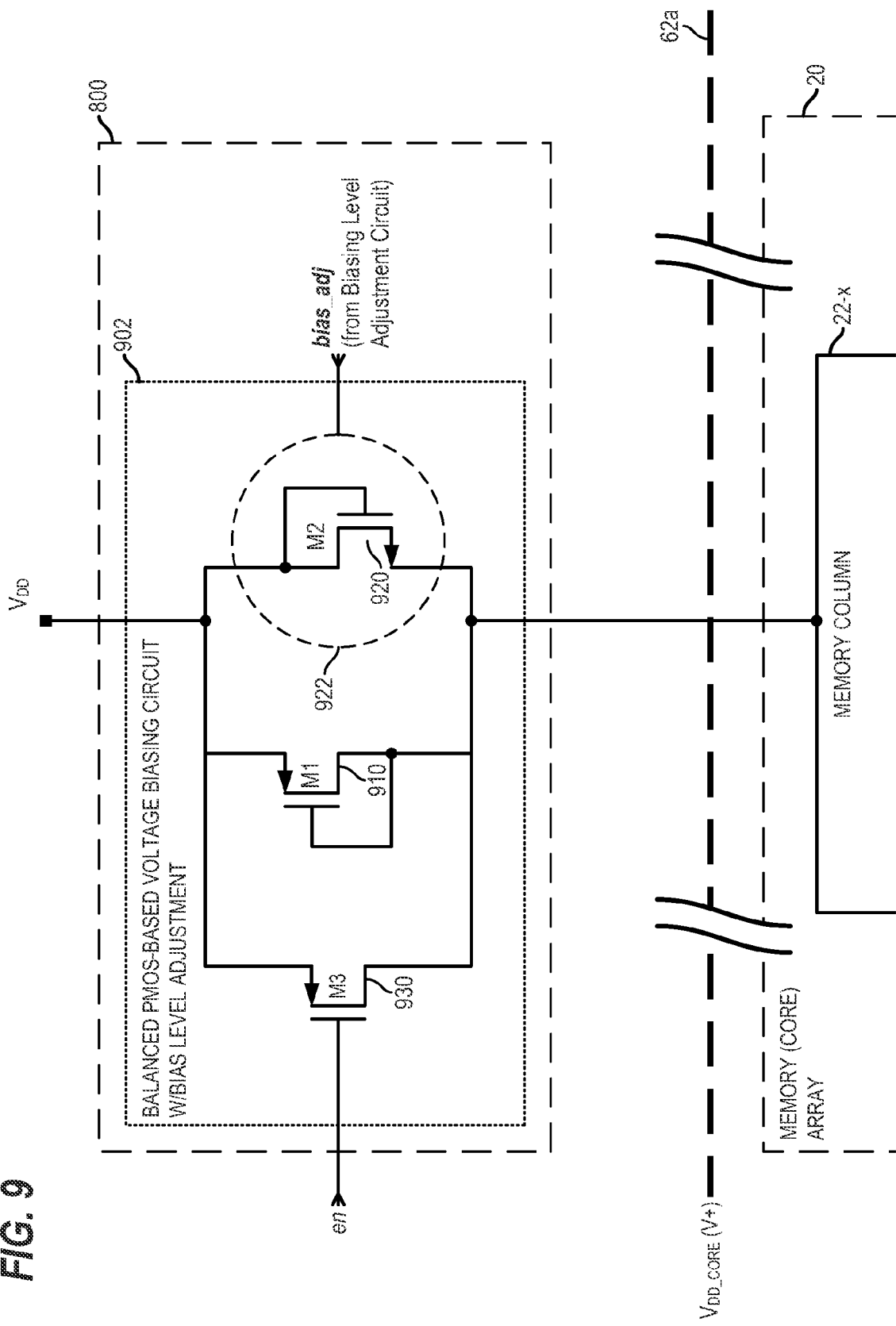
FIG. 9 is a circuit diagram of a balanced PMOS-based voltage biasing circuit having a bias level adjustment mechanism configured in accordance with various aspects of the disclosed approach for process tolerant reduction of current leakage in SRAMs that may be used in the balanced PMOS-based voltage biasing architecture of FIG. 8.

FIG. 9 illustrates a balanced PMOS-based voltage biasing circuit 902 that may be implemented as the voltage biasing circuit 802 in the balanced PMOS-based voltage biasing circuit 800 of the balanced PMOS-based voltage biasing architecture 80 of FIG. 8 for biasing the voltage level of $V_{DD}$ to arrive at the biased voltage level of $V_{DD\_CORE}$ for the memory array 20. The balanced PMOS-based voltage biasing circuit 902 includes a first semiconductor device M1 910 and a second semiconductor device M2 920. In one aspect of the disclosed approach, the first semiconductor device M1 910 is a PMOS device and the second semiconductor device M2 920 is an NMOS device. A third semiconductor device M3 930, which is a PMOS device, may be operated by an "en" signal to control the operation of the balanced PMOS-based voltage biasing circuit 902. Specifically, a low enable signal will allow the third semiconductor device M3 930 to bring $V_{DD\_CORE}$ close to $V_{DD}$ so that the memory column 22-x may operate in an active state. When the enable signal is high, the third semiconductor device M3 930 will turn off (i.e., become non-conductive), and the pair of semiconductors will be engaged. For the first semiconductor device M1 910, its gate and drain terminals are connected to $V_{DD\_CORE}$ and its source terminal is connected to $V_{DD}$. The second semiconductor device M2 920 has its source terminal coupled to $V_{DD\_CORE}$ and its gate and drain terminals connected to $V_{DD}$.

Figure 10:
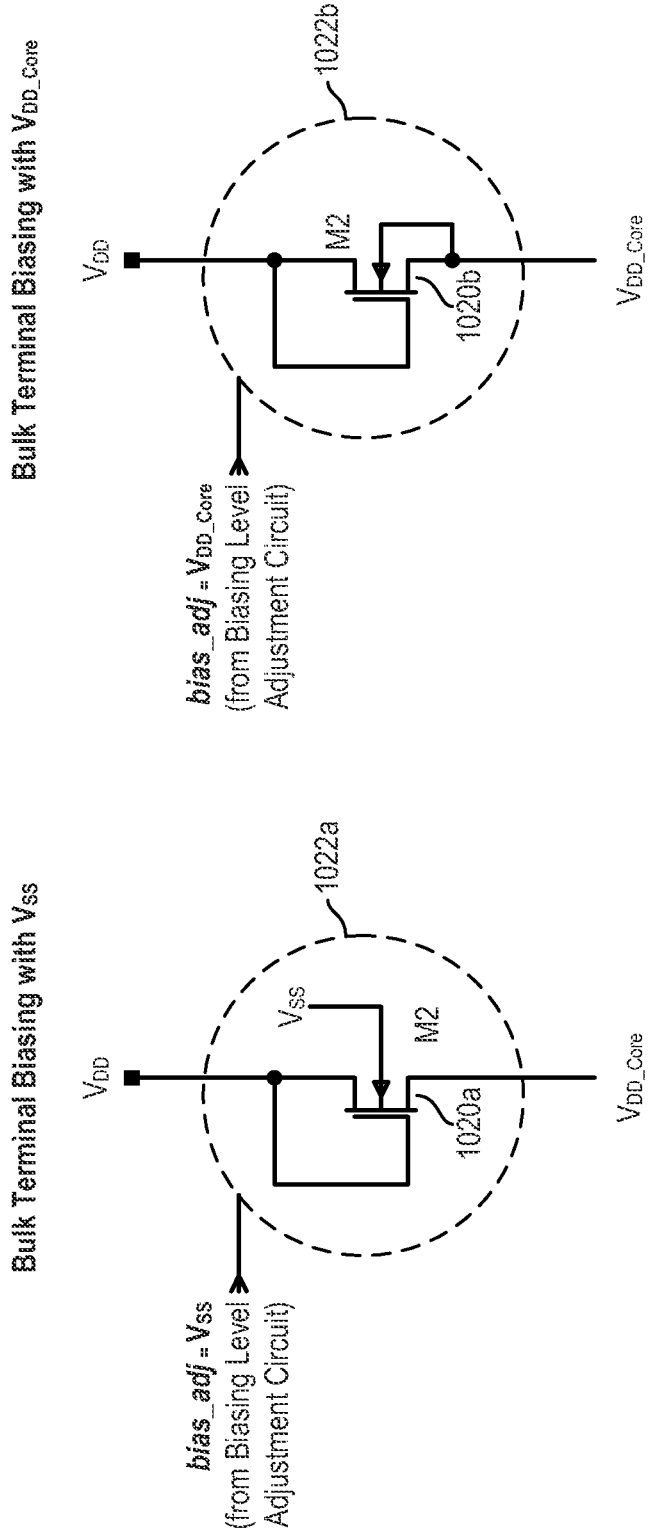
FIGS. 10a-b are circuit diagrams that may be used to describe various approaches to providing the bias level adjustment mechanism of FIG. 4.

Similar to the operation of the balanced NMOS-based voltage biasing circuit 402, a body 922 of the second semiconductor device M2 920 may be adjusted by a bias adjustment voltage via a "bias_adj" signal from a biasing level adjustment source such as the voltage biasing level adjustment circuit 804. In contrast to FIGS. 5a-b, where $V_{DD}$ and $V_{SS\_CORE}$ are provided to the body 422 of the second semiconductor device M2 420 in the balanced NMOS-based voltage biasing circuit 402, which is a PMOS device, FIGS. 10a-b illustrate that $V_{SS}$ and $V_{DD\_CORE}$ may be applied to the body 922 of the second semiconductor device M2 920, where the second semiconductor device M2 920 is an NMOS device. Specifically, FIG. 10a illustrates that a bias_adj signal of $V_{SS}$ may be provided to the body 922 of the second semiconductor device M2 920, designated as 1022a and 1020a, respectively, while FIG. 10b illustrates that a bias_adj signal of $V_{DD\_CORE}$ may be provided to the body 922 of the second semiconductor device M2 920, designated as 1022b and 1020b, respectively. In another aspect of the disclosed approach, a biasing circuit may be used to provide an adjustment voltage to the bulk of the second semiconductor device M2 920 that may range from a negative voltage rail (Vss) to the adjustable biased voltage (e.g., $V_{DD\_CORE}$).

Figure 11:
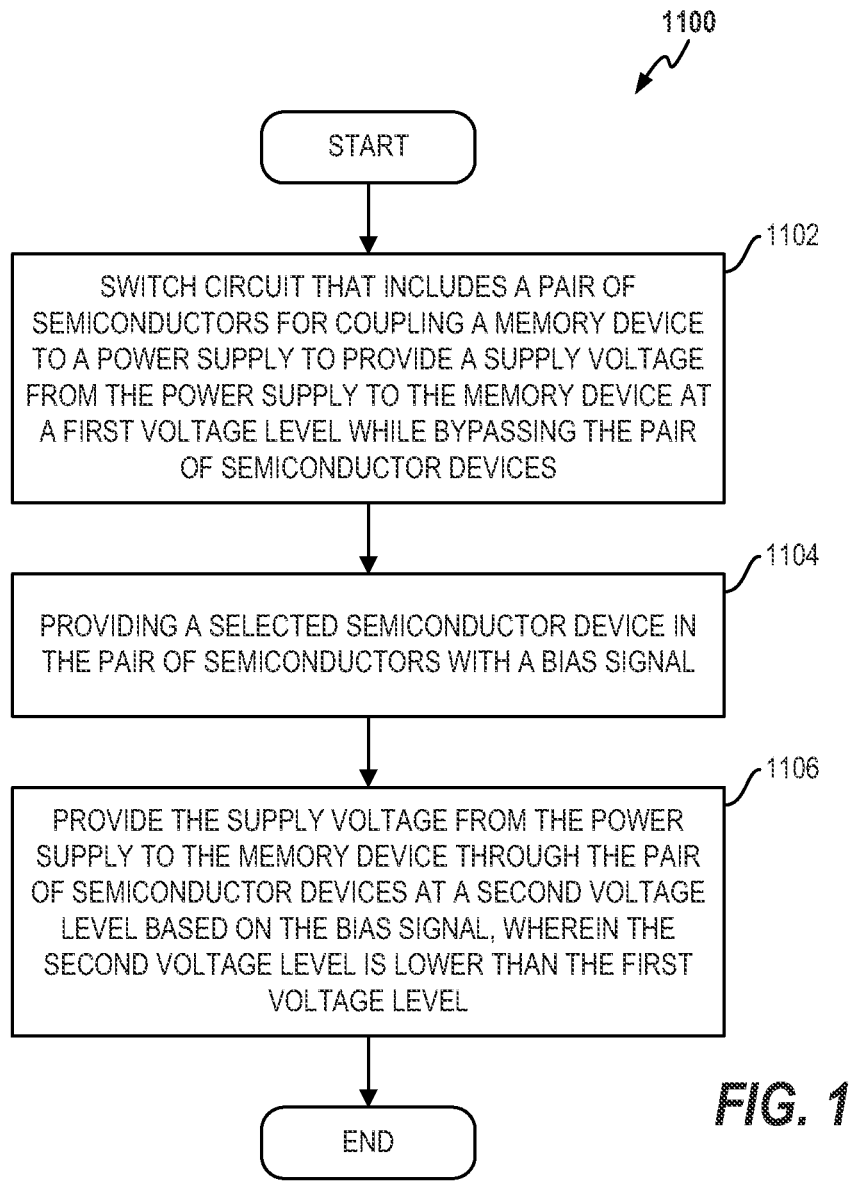
FIG. 11 is a flow diagram describing an operation of a process tolerant balanced voltage biasing circuit configured in accordance with various aspects of the disclosed approach.

FIG. 11 illustrates a process 1100 configured in accordance with various aspects of the disclosed process tolerant approach to provide for current leakage reduction in a memory device while being power efficient. The memory device is coupled to a power supply through a circuit that includes a pair of semiconductor devices, each being one of a P-type semiconductor device or an N-type semiconductor device. At 1102, the circuit is switched to provide a supply voltage from the power supply to a memory core of the memory device at a first voltage level while bypassing the pair of semiconductor devices. In one aspect of the disclosed approach, the first voltage level may provide enough headroom needed by the memory core to operate in an active mode. Typically, the headroom may equal to a full range of the power supply.

At 1104, a selected semiconductor device in the pair of semiconductors is provided with a bias adjustment signal to adjust an operational parameter of the selected semiconductor device. In one aspect of the disclosed approach, the selected semiconductor device is either one of the P-type semiconductor device or the N-type semiconductor device, as disclosed above, and the bias adjustment signal may be configured to adjust an operational parameter of the selected semiconductor device to match an average operational parameter of all other semiconductor devices of the same type in the memory device. For example, if the selected semiconductor device in the pair of semiconductor devices is a P-type semiconductor device, such as the second semiconductor device M2 420 of FIG. 4 (i.e., a PMOS device), then the $V_{THP}$ of the selected semiconductor device may be reduced similar to how the $V_{THP}$ of the second semiconductor device M2 420 is reduced as discussed above.

At 1106, the circuit is switched to provide the supply voltage from the power supply to the memory device through the pair of semiconductor devices at a second voltage level based on the bias adjustment signal, wherein the second voltage level is lower than the first voltage level but higher than a minimal voltage level for the memory device to retain any data that is stored in the memory device. As discussed, this mode of operation of the memory device is referred to as a sleep-retention or a data-retention mode, where the memory device may save power by operating in a non-active state, yet still be ready to return to the active mode and provide the data stored therein. In one aspect of the disclosed approach, the second voltage level will be based on the adjusted operational parameter of the selected semiconductor device such that a voltage headroom provided to the memory device is reduced. For example, the second voltage level may be determined by a voltage drop of $V_{THP}$ of the second semiconductor device if $V_{THP}$ of the second semiconductor device is less than a threshold voltage of the first semiconductor device.

In accordance with various aspects of the disclosed approach, the circuit for reducing the voltage headroom includes means for adjusting an operational parameter of a selected semiconductor device in the pair of semiconductors based on the supply voltage such that the second voltage level approaches a minimal voltage level for the memory device to operate in a data retention mode. In one aspect, the aforementioned means may be a bias adjustment signal provided to the semiconductor device in a configuration to achieve the functions recited by the aforementioned means. For example, the bias adjustment signal may be provided to a bulk terminal of the selected semiconductor device in a configuration as shown in FIGS. 4 and 5a,b, where the selected semiconductor device may be the second semiconductor device M2 420, a PMOS device, and the bias adjustment signal may be $V_{DD}$ or $V_{SS\_CORE}$. Thus, the bias adjustment signal will change the threshold voltage $V_{THP}$ of the second semiconductor device M2 420 to reduce the voltage headroom. As another example, in the configuration shown by FIGS. 9 and 10a,b, the selected semiconductor device may be the second semiconductor device M2 920, an NMOS device, and the bias adjustment signal may be $V_{SS\_CORE}$ or $V_{SS}$. These signals may be provided by a one or more respect nets coupled to an appropriate rail of the power supply. For example, the bias adjustment signal of $V_{DD}$ may be obtained from the positive voltage rail of 12a in FIG. 1. A summary of example bias adjustment signals described herein and respective sources from where they may be obtained is provided in Table 1, below:

TABLE 1

Example Sources of Bias Adjustment Signals

| Bias Adjustment Signal | Source |
| --- | --- |
| $V_{DD}$ | Positive voltage rail 12a |
| $V_{DD\ CORE}$ | Positive voltage rail 62a |
| $V_{SS\ CORE}$ | Negative voltage rail 12b |
| $V_{SS}$ | Negative voltage rail 62b |

Figure 12:
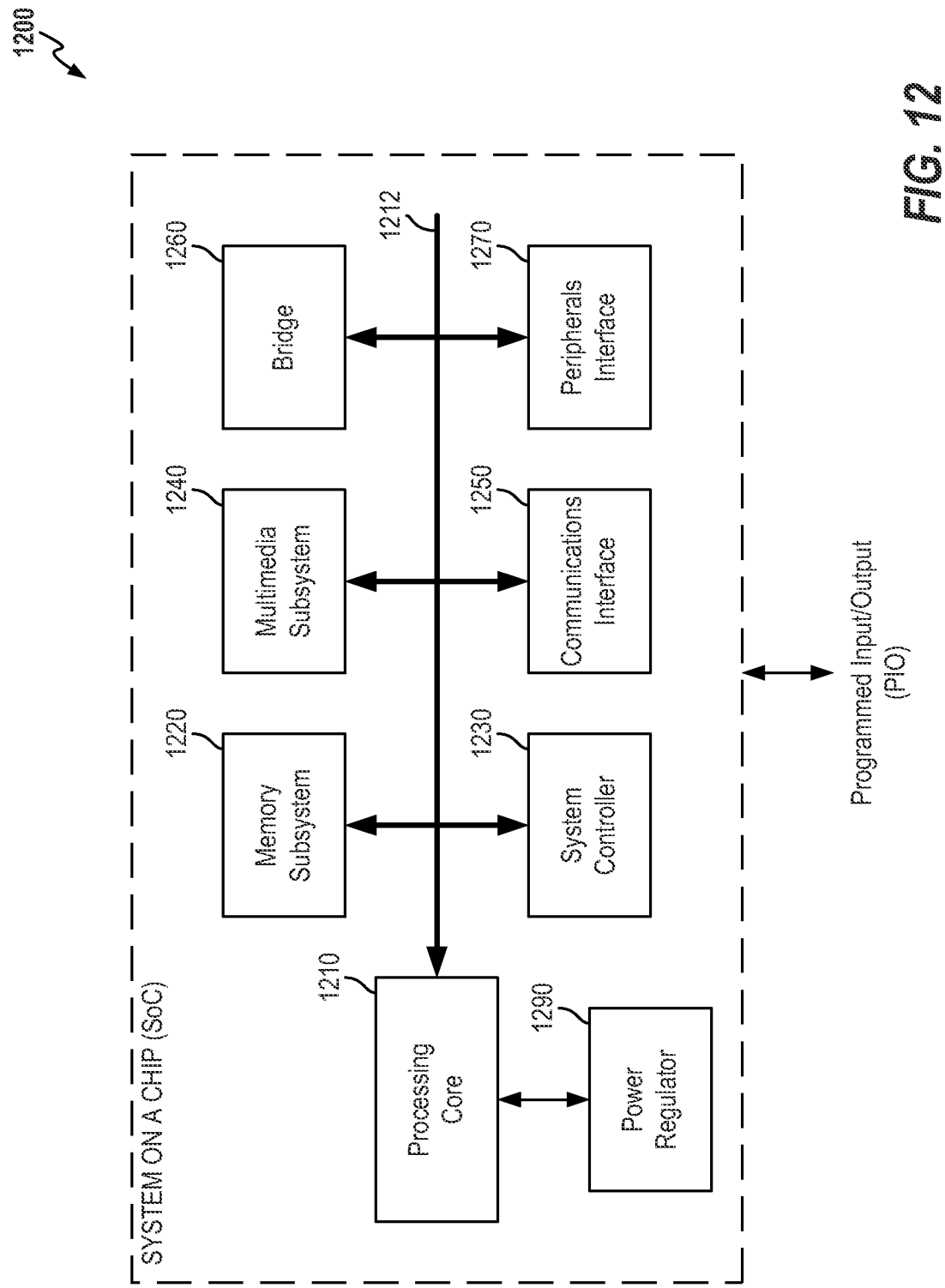
FIG. 12 is a block diagram conceptually illustrating an example of a system on a chip (SoC) in which the process tolerant balanced voltage biasing architecture of FIGS. 3 and 8 may be used.

FIG. 12 illustrates a typical system on a chip (SoC) 1200 in which various aspects of the disclosed approach for balanced source voltage biasing may be utilized. The SoC 1200 includes a processing core 1210 and a memory subsystem 1220, supported by a system controller 1230 and various other modules, components, and subsystems (referred to generally as subsystems) such as a multimedia subsystem 1240, a communications interface 1250, and a peripherals interface 1270, as further described herein. A bus 1212 and a bridge 1260 may be included to interconnect the various subsystems in the SoC 1200. Further, the SoC 1200 also includes a power regulator 1290 coupled to the processing core 1210 to provide voltage and current regulation for the various subsystems in the SoC 1200. In one aspect of the disclosed approach, the SoC 1200 may be implemented in a single integrated circuit. In another aspect of the disclosed approach, the various modules and subsystems may be implemented as a system-in-package (SiP), in which a number of integrated circuits may be enclosed in a single package, or chip carrier. Thus, the functionality described herein for the SoC 1200 may also be implemented using multiple integrated circuits in the SiP, but similarly integrated into the single package.

The processing core 1210 may include one or more microcontrollers, microprocessors, or digital signal processing (DSP) cores. Depending on the specific requirements for the SoC 1200, the processing core 1210 may also include field programmable gate arrays (FPGAs), programmable logic devices (PLDs), state machines, gated logic, discrete hardware circuits, and other suitable hardware configured to perform the various functionality described throughout this disclosure.

The system controller 1230 may include modules that may be used to provide control and timing for the SoC 1200. For example, the system controller 1230 may include timing sources that may be used to control and provide timing necessary for operation of various modules and subsystems in the SoC 1200. For example, the system controller 1230 may include various timers such as real-time clocks for driving timing of operation of various logic; watchdog timers for detecting and initiating recovery from any malfunctions using modules such as a power-on reset (PoR) generators; and counter-timers. To implement these clocks and timers, the system controller 1230 may include oscillators and phase-locked loop (PLL) modules.

The SoC 1200 may provide display output for a display (not shown) via the multimedia subsystem 1240. The multimedia subsystem 1240 may include a graphics processing unit (GPU), video device drivers, and other devices used to produce graphics display information. The multimedia subsystem 1240 may also provide for input of multimedia if the SoC 1200 is to feature video or image capture functionality from devices such as from a camera or image sensor. In addition to imaging functionality, the multimedia subsystem 1240 may also provide for audio processing for both audio input and output. In general, as used herein the multimedia subsystem 1240 is an abstraction of a module that handles all multimedia functionality requested of the SoC 1200. As mobile devices become more versatile, the multimedia subsystem 1240 may be used to provide other functionality.

The communications interface 1250 provides an interface between the SoC 1200 and external communications interfaces, such as one or more transceivers. The one or more transceivers may conform to one or more communications standards, and provide a means for communicating with various other apparatus over a transmission medium. For example, an external communications interface may include a wireless transceiver with radio frequency (RF) circuitry and components to allow the SoC 1200 to communicate on a mobile network. Other external communications interfaces may include transceivers for local area networks (LANs), including wireless LANs (WLANs), and metropolitan or wide area networks (WANs). MAC and PHY layer components may be implemented in the SoC 1200 or in one or more communication interfaces.

The memory subsystem 1220 may include a selection of memory devices. One or more of these memory devices may be configured to operate in a sleep-retention mode to save power when these memory devices do not need to be in an active mode. These memory devices may be placed in the sleep-retention mode with power supplied by any of the voltage biasing mechanisms discussed above. In one aspect of the disclosed approach, the memory subsystem 1220, referred to generally as a computer-readable medium, may be used for storing data that is manipulated by the processing core 1210 or other subsystems of the SoC 1200 when executing software or algorithms. These instructions or code that make up the software or describe various algorithms in the software may themselves be stored in the memory subsystem 1220. Although illustrated as being located in the SoC 1200, conceptually the memory subsystem 1220 may include memory components that reside externally to the SoC 1200, and distributed across multiple devices or entities.

The computer-readable medium may be a non-transitory computer-readable medium such as a computer-readable storage medium. Non-transitory computer-readable media may include, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a processor in a computer or in the processing core 1210. The computer-readable medium may also include, by way of example, a carrier wave, a transmission line, and any other suitable medium for transmitting software and/or instructions that may be accessed and read by a processor in a computer or in the processing core 1210. The computer-readable medium may be embodied in a computer program product. By way of example, the computer program product may include a computer-readable medium in packaging materials. Those skilled in the art will recognize how best to implement the described functionality presented throughout this disclosure depending on the particular application and the overall design constraints imposed on the overall system.

The SoC 1200 may be implemented as having a bus architecture, represented generally by the bus 1212 in FIG. 12, and include any number of interconnecting buses and bridges, such as the bridge 1260, depending on the specific application of the SoC 1200 and overall design constraints. The bus 1212 links together the various subsystems of the SoC 1200 that, as discussed, may include one or more processors (represented generally by the processing core 1210), the memory subsystem 1220, and various other subsystems described herein. The bus 1212 may include one or more direct memory access (DMA) controllers to route data directly between the memory subsystem 1220 and other subsystems, bypassing the processing core 1210 and thereby increasing data throughput of the SoC 1200. For example, the multimedia subsystem 1240 may include one or GPUs, as discussed above. These GPUs, which are specialized processing devices that may be more powerful in some aspects than processing devices in the processing core 1210, typically require high speed access to read and write data in the memory subsystem 1220 for storing and manipulating display data, such as frame buffer data. The DMA controllers allow a GPU to directly interact with the memory subsystem 1220, bypassing and avoiding the creation of any bottlenecks by its access.

The peripherals interface 1270 may be used to support communications with peripheral devices coupled to the SoC 1200 using external interfaces confirming to such industry standards as Universal Serial Bus (USB), FireWire, Universal Synchronous/Asynchronous Receiver/Transmitter (USART), and Serial Peripheral Interface (SPI) busses. The peripherals interface 1270 may also include analog interfaces such as digital-to-analog converters (DAC) and analog-to-digital converters (ADC). These peripheral devices may be used to extend the functionality of the SoC 1200.

To provide power to the SoC 1200, the power regulator 1290 may include voltage regulators and power management circuits that interface with power supply components such as one or more power amplifiers, batteries, and converters. In one aspect of the disclosed approach, the power regulator 1290 provides power to the SoC 1200 based on control information received from the processing core 1210. The power regulator 1290 may also receive control signals from the system controller 1230. Power from the power regulator 1290 may be delivered via a power delivery circuit that may include filtering functions. Further, although modern SoCs such as those used in mobile applications include a high level of integration, may designs still dictate that processing and GPU modules operate on their own independent power planes. Thus, the power regulator 1290 may also support multiple power planes as necessary.

Those of ordinary skill in the art would appreciate that any of the components, blocks, modules, means, circuits, and algorithm steps described in connection with the various aspects of the disclosed approach provided herein may be implemented as electronic hardware (e.g., a digital implementation, an analog implementation, or a combination of the two, which may be designed using drain coding or some other technique), various forms of program or design code incorporating instructions (which may be referred to herein, for convenience, as "software" or a "software module"), or combinations of both. To better illustrate this interchangeability of hardware and software, the various illustrative components, blocks, modules, means, circuits, and algorithm steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an IC.

The IC may include a general purpose processor, a DSP, an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A memory device biasing circuit, comprising:
  a pair of semiconductor devices configured to:
    receive a supply voltage from a power supply providing a supply voltage level suitable for operating a memory device in an active mode; and
    provide, using the supply voltage, an adjustable biased voltage to the memory device that is greater than a minimal voltage level for operating the memory device in a data retention mode, the pair of semiconductor devices comprising:
      a first semiconductor device; and,
      a second semiconductor device, wherein the second semiconductor device comprises an opposite type of semiconductor device than the first semiconductor device such that the pair of semiconductor devices comprises each of an N-type semiconductor device and a P-type semiconductor device; and,
  a bias adjustment circuit coupled to the second semiconductor device and configured to adjust the operation of the second semiconductor device based on the supply voltage.

2. The memory device biasing circuit of claim 1, wherein the bias adjustment circuit is coupled to a bulk portion of the second semiconductor device and configured to provide a bias adjustment voltage to the bulk portion that is different than a drain voltage at the second semiconductor device.

3. The memory device biasing circuit of claim 2, wherein the first semiconductor device comprises a PMOS device, the second semiconductor comprises an NMOS device, and the bias adjustment voltage is lower than the drain voltage at the NMOS device.

4. The memory device biasing circuit of claim 3, wherein the power supply comprises a positive voltage rail and a negative voltage rail, and the bias adjustment voltage provided to the bulk portion of the NMOS device comprises an adjustment voltage ranging from the negative voltage rail to the adjustable biased voltage.

5. The memory device biasing circuit of claim 2, wherein the first semiconductor device comprises an NMOS device, the second semiconductor comprises a PMOS device, and the bias adjustment voltage is higher than the drain voltage at the PMOS device.

6. The memory device biasing circuit of claim 5, wherein the PMOS device is subject to well proximity effects, and the bias adjustment circuit is configured adjust the bias adjustment voltage to reduce these effects.

7. The memory device biasing circuit of claim 5, wherein the power supply comprises a positive voltage rail and a negative voltage rail, and the bias adjustment voltage provided to the bulk portion of the PMOS device comprises an adjustment voltage ranging from the adjustable biased voltage to the positive voltage rail.

8. The memory device biasing circuit of claim 2, wherein the bias adjustment circuit is configured to adjust the bias adjustment voltage to reduce a threshold voltage of the second semiconductor device.

9. A method for current leakage reduction in a semiconductor device comprising:

switching a circuit comprising a pair of semiconductor devices, the circuit being coupled to a memory device and configured to provide a supply voltage from a power supply to the memory device at a first voltage level while bypassing the pair of semiconductor devices;

adjusting an operational parameter of a selected semiconductor device in the pair of semiconductors using a bias adjustment signal; and, reducing, based on the bias adjustment signal, a level of the supply voltage provided by the power supply to the memory device, the level of the supply voltage being reduced through the pair of semiconductor devices to reach a second voltage level that is greater than a minimal voltage level for the memory device to operate in a data retention mode, wherein the second voltage level is lower than the first voltage level.

10. The method of claim 9, wherein the first voltage level comprises a first voltage headroom for the memory device to operate in an active mode, and the second voltage level comprises a second voltage headroom lower than the first voltage headroom, wherein the second voltage headroom allows the memory device to maintain information stored in the memory device.

11. The method of claim 9, wherein the memory device comprises a memory core and the selected semiconductor device comprises either one of a P-type semiconductor device or an N-type semiconductor device, and the bias adjustment signal is configured to adjust the operational parameter of the selected semiconductor device to match an average of the operational parameter for all semiconductor devices of a similar type in the memory core.

12. The method of claim 9, wherein the adjusting of the operational parameter of the selected semiconductor device comprises providing the bias adjustment signal to a bulk portion of the selected semiconductor device to reduce a threshold voltage of the selected semiconductor device.

13. The method of claim 12, wherein the selected semiconductor device of the pair of semiconductors comprises an NMOS device, the power supply comprises a positive voltage rail and a negative voltage rail, and the bias adjustment signal provided to the bulk portion of the NMOS device comprises an adjustment voltage ranging from the negative voltage rail to the adjustable biased voltage.

14. The method of claim 12, wherein the selected semiconductor device of the pair of semiconductors comprises a PMOS device, the power supply comprises a positive voltage rail and a negative voltage rail, and the bias adjustment signal provided to the bulk portion of the PMOS device comprises an adjustment voltage ranging from the adjustable biased voltage to the positive voltage rail.

15. An apparatus for current leakage reduction in a semiconductor device comprising:

a circuit coupled to a memory device and configured to provide:
  a supply voltage from a power supply to the memory device at a first voltage level to allow the memory device to operate in an active mode, and
  a second voltage level to allow the memory device to operate in a non-active mode, the circuit comprising a pair of semiconductor devices through which the supply voltage from the power supply is provided to the memory device at the second level; and means for adjusting an operational parameter of a selected semiconductor device in the pair of semiconductors based on the supply voltage such that the second voltage level approaches a minimal voltage level for the memory device to operate in a data retention mode.

16. The apparatus of claim 15, wherein the first voltage level comprises a first voltage headroom for the memory device to operate in an active mode, and the second voltage level comprises a second voltage headroom lower than the first voltage headroom for the memory device to maintain information stored in the memory device.

17. The apparatus of claim 15, wherein the memory device comprises a memory core and the selected semiconductor device comprises either one of a P-type semiconductor device or an N-type semiconductor device, and the means for adjusting the operational parameter of the selected semiconductor device comprises means for providing a bias adjustment signal to adjust the operational parameter of the selected semiconductor device to match an average of the operational parameter for all semiconductor devices of a similar type in the memory core.

18. The apparatus of claim 15, wherein the means for adjusting the operational parameter comprises means for providing a bias adjustment signal to a bulk portion of the selected semiconductor device to reduce a threshold voltage of the selected semiconductor device.

19. The apparatus of claim 18, wherein the selected semiconductor device of the pair of semiconductors comprises an NMOS device, the power supply comprises a positive voltage rail and a negative voltage rail, and the bias adjustment signal provided to the bulk portion of the NMOS device comprises an adjustment voltage ranging from the negative voltage rail to the second voltage level.

20. The apparatus of claim 18, wherein the selected semiconductor device of the pair of semiconductors comprises a PMOS device, the power supply comprises a positive voltage rail and a negative voltage rail, and the bias adjustment signal provided to the bulk portion of the PMOS device comprises an adjustment voltage ranging from the second voltage level to the positive voltage rail.

* * * * *